US008269306B2

(12) United States Patent
Sandhu

(10) Patent No.: US 8,269,306 B2
(45) Date of Patent: Sep. 18, 2012

(54) ISOLATION REGIONS

(75) Inventor: Sukesh Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 67 days.

(21) Appl. No.: 12/901,825

(22) Filed: Oct. 11, 2010

(65) Prior Publication Data

US 2011/0024822 A1 Feb. 3, 2011

Related U.S. Application Data

(62) Division of application No. 11/370,124, filed on Mar. 7, 2006, now Pat. No. 7,811,935.

(51) Int. Cl.
*H01L 21/70* (2006.01)

(52) U.S. Cl. ......... 257/510; 257/E21.564; 257/E21.546; 257/E21.548; 257/E21.55; 438/421; 438/42; 438/629; 438/672

(58) Field of Classification Search .................. 438/672, 438/421–422, 629, 675; 257/510, E21.564, 257/E21.545, E21.546, E21.548, E21.55
See application file for complete search history.

(56) References Cited

U.S. PATENT DOCUMENTS

| | | | |
|---|---|---|---|
| 5,065,217 A | | 11/1991 | Verret |
| 5,098,856 A | | 3/1992 | Beyer et al. |
| 5,099,304 A | * | 3/1992 | Takemura et al. ............ 257/647 |
| 5,298,450 A | | 3/1994 | Verret |
| 5,387,539 A | * | 2/1995 | Yang et al. ..................... 438/427 |
| 5,504,033 A | * | 4/1996 | Bajor et al. .................... 438/405 |
| 5,529,955 A | | 6/1996 | Hibino et al. |
| 5,719,085 A | * | 2/1998 | Moon et al. .................... 438/424 |
| 5,747,379 A | * | 5/1998 | Huang et al. .................. 438/586 |
| 5,773,343 A | | 6/1998 | Lee et al. |
| 5,804,249 A | * | 9/1998 | Sukharev et al. ............. 438/669 |
| 5,814,547 A | | 9/1998 | Chang |
| 5,893,744 A | | 4/1999 | Wang |
| 5,994,775 A | | 11/1999 | Zhao et al. |
| 6,057,580 A | | 5/2000 | Watanabe et al. |
| 6,071,794 A | | 6/2000 | Lin et al. |
| 6,146,970 A | | 11/2000 | Witek et al. |
| 6,147,378 A | * | 11/2000 | Liu et al. ........................ 257/316 |
| 6,156,651 A | * | 12/2000 | Havemann .................... 438/674 |
| 6,191,027 B1 | * | 2/2001 | Omura ........................... 438/627 |
| 6,242,303 B1 | | 6/2001 | Wang et al. |
| 6,245,641 B1 | * | 6/2001 | Shiozawa et al. ............. 438/427 |
| 6,300,219 B1 | * | 10/2001 | Doan et al. .................... 438/424 |
| 6,306,723 B1 | * | 10/2001 | Chen et al. .................... 438/429 |
| 6,335,235 B1 | * | 1/2002 | Bhakta et al. ................. 438/221 |
| 6,406,976 B1 | | 6/2002 | Singh et al. |
| 6,448,149 B1 | * | 9/2002 | Lee et al. ....................... 438/424 |

(Continued)

*Primary Examiner* — N Drew Richards
*Assistant Examiner* — Ankush Singal
(74) *Attorney, Agent, or Firm* — Leffert Jay & Polglaze, P.A.

(57) ABSTRACT

A dielectric liner is formed in first and second trenches respectively in first and second portions of a substrate. A layer of material is formed overlying the dielectric liner so as to substantially concurrently substantially fill the first trench and partially fill the second trench. The layer of material is removed substantially concurrently from the first and second trenches to expose substantially all of the dielectric liner within the second trench and to form a plug of the material in the one or more first trenches. A second layer of dielectric material is formed substantially concurrently on the plug in the first trench and on the exposed portion of the dielectric liner in the second trench. The second layer of dielectric material substantially fills a portion of the first trench above the plug and the second trench.

19 Claims, 10 Drawing Sheets

U.S. PATENT DOCUMENTS

| | | |
|---|---|---|
| 6,455,886 B1 | 9/2002 | Mandelman et al. |
| 6,458,697 B2 | 10/2002 | Hayashi |
| 6,482,715 B2 | 11/2002 | Park et al. |
| 6,486,517 B2 | 11/2002 | Park |
| 6,559,029 B2 | 5/2003 | Hur |
| 6,583,466 B2 * | 6/2003 | Lin et al. ............... 257/314 |
| 6,596,607 B2 | 7/2003 | Ahn |
| 6,627,499 B2 | 9/2003 | Osawa |
| 6,642,596 B2 * | 11/2003 | Hong ..................... 257/429 |
| 6,656,783 B2 * | 12/2003 | Park ....................... 438/221 |
| 6,686,242 B2 | 2/2004 | Willer et al. |
| 6,690,051 B2 | 2/2004 | Hurley et al. |
| 6,693,018 B2 * | 2/2004 | Kim et al. ............... 438/418 |
| 6,710,403 B2 | 3/2004 | Sapp |
| 6,720,217 B2 | 4/2004 | Kim et al. |
| 6,750,117 B1 * | 6/2004 | Hung et al. ............. 438/437 |
| 6,756,654 B2 | 6/2004 | Heo et al. |
| 6,774,007 B2 | 8/2004 | Liu et al. |
| 6,777,725 B2 * | 8/2004 | Willer et al. ........... 257/244 |
| 6,790,773 B1 | 9/2004 | Drewery et al. |
| 6,798,038 B2 * | 9/2004 | Sato et al. .............. 257/510 |
| 6,806,137 B2 | 10/2004 | Tran et al. |
| 6,835,649 B2 * | 12/2004 | Lee et al. ................ 438/629 |
| 6,838,737 B2 | 1/2005 | Kim et al. |
| 6,844,591 B1 | 1/2005 | Tran |
| 6,870,212 B2 | 3/2005 | Chang et al. |
| 6,939,780 B2 * | 9/2005 | Yun et al. ............... 438/437 |
| 6,946,359 B2 * | 9/2005 | Yang et al. ............. 438/425 |
| 6,949,801 B2 | 9/2005 | Parat et al. |
| 6,960,818 B1 | 11/2005 | Rengarajan et al. |
| 6,969,686 B2 | 11/2005 | Hsieh et al. |
| 6,995,095 B2 | 2/2006 | Yu |
| 7,074,691 B2 | 7/2006 | Sato et al. |
| 7,075,145 B2 | 7/2006 | Williams et al. |
| 7,098,116 B2 | 8/2006 | Lu et al. |
| 7,151,043 B2 * | 12/2006 | Kim et al. ............... 438/435 |
| 7,151,295 B2 * | 12/2006 | Yaegashi et al. ....... 257/316 |
| 7,160,787 B2 * | 1/2007 | Heo et al. ............... 438/424 |
| 7,163,863 B2 | 1/2007 | Shone |
| 7,163,869 B2 * | 1/2007 | Kim et al. ............... 438/424 |
| 7,166,539 B2 * | 1/2007 | Fucsko et al. .......... 438/753 |
| 7,169,681 B2 | 1/2007 | Cho et al. |
| 7,183,214 B2 | 2/2007 | Nam et al. |
| 7,208,391 B2 | 4/2007 | Sato et al. |
| 7,208,812 B2 * | 4/2007 | Ohta ....................... 257/510 |
| 7,271,060 B2 | 9/2007 | Sandhu et al. |
| 7,416,937 B2 * | 8/2008 | Koh ........................ 438/248 |
| 7,611,963 B1 * | 11/2009 | Yang et al. ............. 438/426 |
| 8,012,847 B2 * | 9/2011 | Patraw et al. ........... 438/427 |
| 2001/0017422 A1 | 8/2001 | Oda |
| 2002/0055258 A1 | 5/2002 | Nakasato |
| 2002/0072198 A1 * | 6/2002 | Ahn ........................ 438/424 |
| 2002/0076879 A1 * | 6/2002 | Lee et al. ............... 438/241 |
| 2002/0076900 A1 * | 6/2002 | Park et al. ............... 438/424 |
| 2002/0137307 A1 | 9/2002 | Kim et al. |
| 2002/0142550 A1 * | 10/2002 | Kumamoto ............. 438/296 |
| 2003/0013271 A1 * | 1/2003 | Knorr et al. ............ 438/435 |
| 2003/0013272 A1 * | 1/2003 | Hong et al. ............. 438/437 |
| 2003/0030121 A1 * | 2/2003 | Heo et al. ............... 257/499 |
| 2003/0119263 A1 * | 6/2003 | Lee et al. ............... 438/259 |
| 2003/0134510 A1 | 7/2003 | Lee et al. |
| 2003/0143852 A1 | 7/2003 | En-Ho et al. |
| 2003/0201473 A1 | 10/2003 | Liu et al. |
| 2003/0227072 A1 | 12/2003 | Forbes et al. |
| 2003/0235975 A1 * | 12/2003 | Tran ....................... 438/598 |
| 2004/0029398 A1 * | 2/2004 | Lee et al. ............... 438/774 |
| 2004/0032006 A1 * | 2/2004 | Yun et al. ............... 257/510 |
| 2004/0067618 A1 * | 4/2004 | Chang et al. ........... 438/264 |
| 2004/0126990 A1 * | 7/2004 | Ohta ....................... 438/435 |
| 2004/0198019 A1 | 10/2004 | Yasui et al. |
| 2004/0248375 A1 * | 12/2004 | McNeil et al. ......... 438/435 |
| 2005/0009293 A1 | 1/2005 | Kim et al. |
| 2005/0023701 A1 * | 2/2005 | Kajita et al. ........... 257/774 |
| 2005/0074938 A1 | 4/2005 | Han |
| 2005/0173750 A1 | 8/2005 | Park |
| 2005/0176214 A1 * | 8/2005 | Chang et al. ........... 438/424 |
| 2005/0189654 A1 | 9/2005 | Kurokawa et al. |
| 2005/0253199 A1 * | 11/2005 | Nagaoka ................. 257/374 |
| 2005/0258463 A1 * | 11/2005 | Yaegashi et al. ....... 257/296 |
| 2005/0266647 A1 * | 12/2005 | Kim et al. ............... 438/296 |
| 2005/0285177 A1 * | 12/2005 | Shone ..................... 257/315 |
| 2005/0287731 A1 * | 12/2005 | Bian et al. .............. 438/201 |
| 2006/0003546 A1 | 1/2006 | Klipp et al. |
| 2006/0022242 A1 | 2/2006 | Sugatani et al. |
| 2006/0094203 A1 * | 5/2006 | Choi et al. .............. 438/424 |
| 2006/0115952 A1 | 6/2006 | Wu |
| 2006/0138667 A1 | 6/2006 | Lee |
| 2006/0151855 A1 * | 7/2006 | Kiyotoshi et al. ...... 257/618 |
| 2006/0152978 A1 | 7/2006 | Forbes |
| 2006/0166437 A1 | 7/2006 | Korber |
| 2006/0170020 A1 * | 8/2006 | Ohta et al. .............. 257/295 |
| 2006/0205150 A1 | 9/2006 | Dong |
| 2006/0223279 A1 * | 10/2006 | Patraw et al. ........... 438/427 |
| 2006/0228866 A1 * | 10/2006 | Ryan et al. ............. 438/435 |
| 2006/0246657 A1 * | 11/2006 | Kim et al. ............... 438/243 |
| 2006/0255426 A1 * | 11/2006 | Inoue et al. ............. 257/510 |
| 2006/0264003 A1 * | 11/2006 | Eun ........................ 438/424 |
| 2007/0018207 A1 | 1/2007 | Prinz |
| 2007/0032039 A1 | 2/2007 | Chen et al. |
| 2007/0063258 A1 * | 3/2007 | Violette .................. 257/315 |
| 2007/0114631 A1 | 5/2007 | Sato et al. |
| 2007/0128870 A1 * | 6/2007 | Chen ....................... 438/689 |
| 2007/0190728 A1 | 8/2007 | Sreekantham et al. |
| 2007/0278624 A1 | 12/2007 | Anderson et al. |
| 2008/0003773 A1 * | 1/2008 | Kwak et al. ............ 438/425 |
| 2008/0206976 A1 * | 8/2008 | Kitamura et al. ....... 438/593 |

* cited by examiner

ISOLATION REGIONS

RELATED APPLICATION

This application is a divisional of U.S. application Ser. No. 11/370,124, titled, "ISOLATION REGIONS AND THEIR FORMATION," filed Mar. 7, 2006, now U.S. Pat. No. 7,811,935, which is commonly assigned and incorporated in its entirety herein by reference.

FIELD

The present invention relates generally to isolation in integrated circuit devices and in particular the present invention relates to isolation regions and their formation.

BACKGROUND

Integrated circuit devices are typically formed on semiconductor substrates using semiconductor fabrication methods. Isolation trenches are often formed in a substrate and filled with a dielectric, e.g., shallow trench isolation (STI), to provide voltage isolation between components of an integrated circuit device. The isolation trenches are often filled using a physical deposition process, e.g., with high-density plasma (HDP) oxides. However, in the quest for smaller integrated circuit devices, spacing requirements between components often require the isolation trenches to have relatively narrow widths, resulting in large aspect (or trench-depth-to-trench-width) ratios. The large aspect ratios often cause voids to form within the dielectric while filling these trenches using physical sputtering processes.

Memory device fabrication is an example where problems exist with filling large-aspect-ratio isolation trenches. In general, memory devices contain an array of memory cells for storing data, and row and column decoder circuits coupled to the array of memory cells for accessing the array of memory cells in response to an external address. During fabrication, the isolation trenches are formed between successive columns of memory cells of the array and are filled with dielectrics to electrically isolate the columns from each other. As memory devices continue to become smaller in size, the spacing between the columns is reduced and thus exacerbates the problems of void formation.

For the reasons stated above, and for other reasons stated below which will become apparent to those skilled in the art upon reading and understanding the present specification, there is a need in the art for alternative trench filling processes.

DETAILED DESCRIPTION

Figure 1:
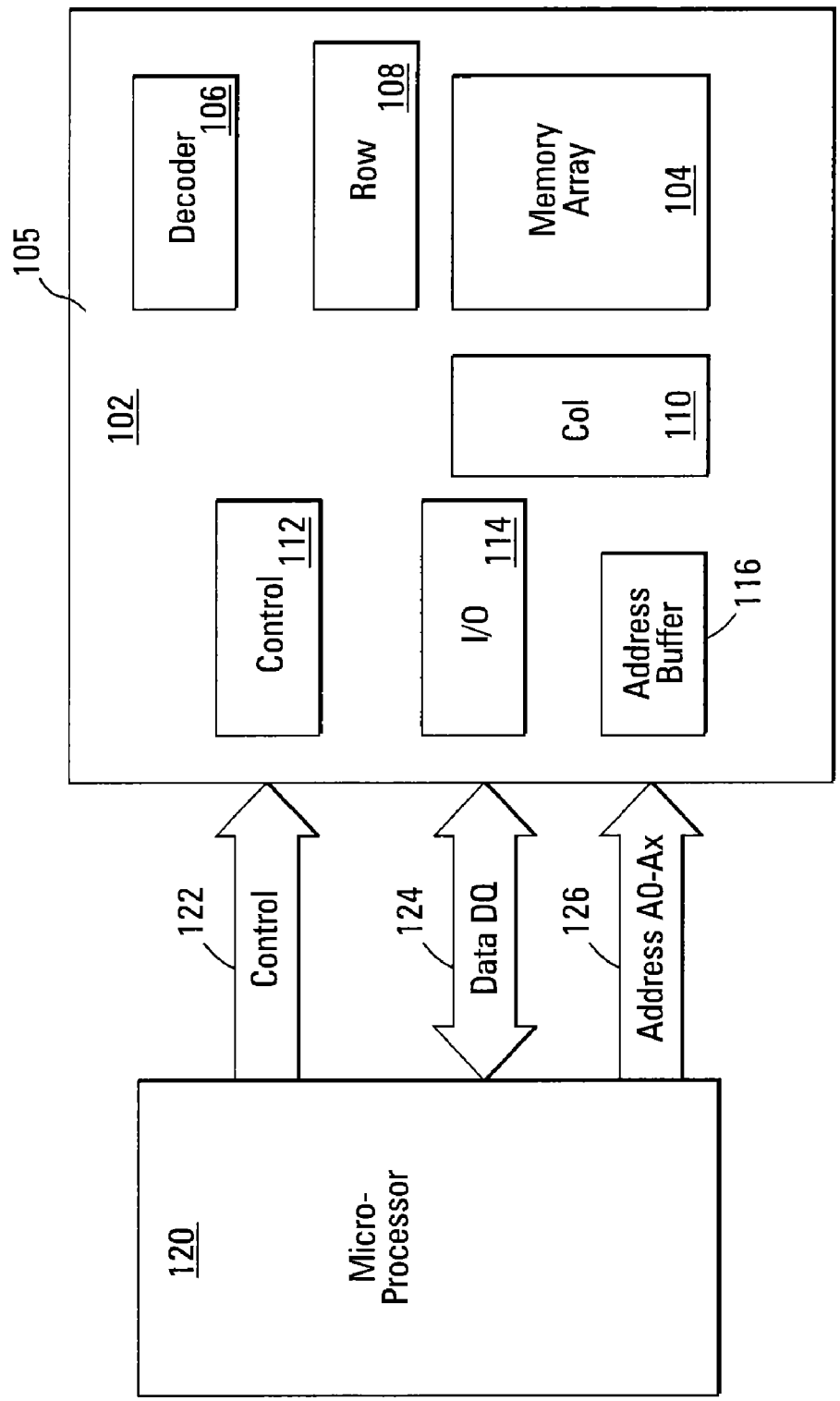
FIG. 1 is a block diagram illustration of an integrated circuit device, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a block diagram illustration of an integrated circuit device, such as a processor, a memory device 102, etc., according to an embodiment of the invention. The memory device 102 may be fabricated as semiconductor device on a semiconductor substrate. Examples of memory devices include NAND, NOR, or NROM flash memory devices, dynamic random access memory devices (DRAMs), static random access memory devices (SRAMs), or the like.

For one embodiment, memory device 102 includes an array of flash memory cells 104 and a region 105 peripheral to memory array 104 that includes an address decoder 106, row access circuitry 108, column access circuitry 110, control circuitry 112, Input/Output (I/O) circuitry 114, and an address buffer 116. The row access circuitry 108 and column access circuitry 110 may include high-voltage circuitry, such as high-voltage pumps. The device of FIG. 1 includes isolation regions formed in accordance with an embodiment of the invention, e.g., between region 105 and memory 104 as well as within memory array 104. It will be appreciated by those skilled in the art that various integrated circuit devices include passive elements, such as capacitors, and active elements, such as transistors, and that for some embodiments such active and passive elements are formed in the periphery.

Memory device 102 may be coupled an external microprocessor 120, or memory controller, for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

The memory array 104 includes memory cells arranged in row and column fashion. For one embodiment, each of the memory cells includes a floating-gate field-effect transistor capable of holding a charge. The cells may be grouped into blocks. Each of the cells within a block can be electrically programmed on an individual basis by charging the floating gate. The charge can be removed from the floating gate by a block erase operation.

Figure 2:
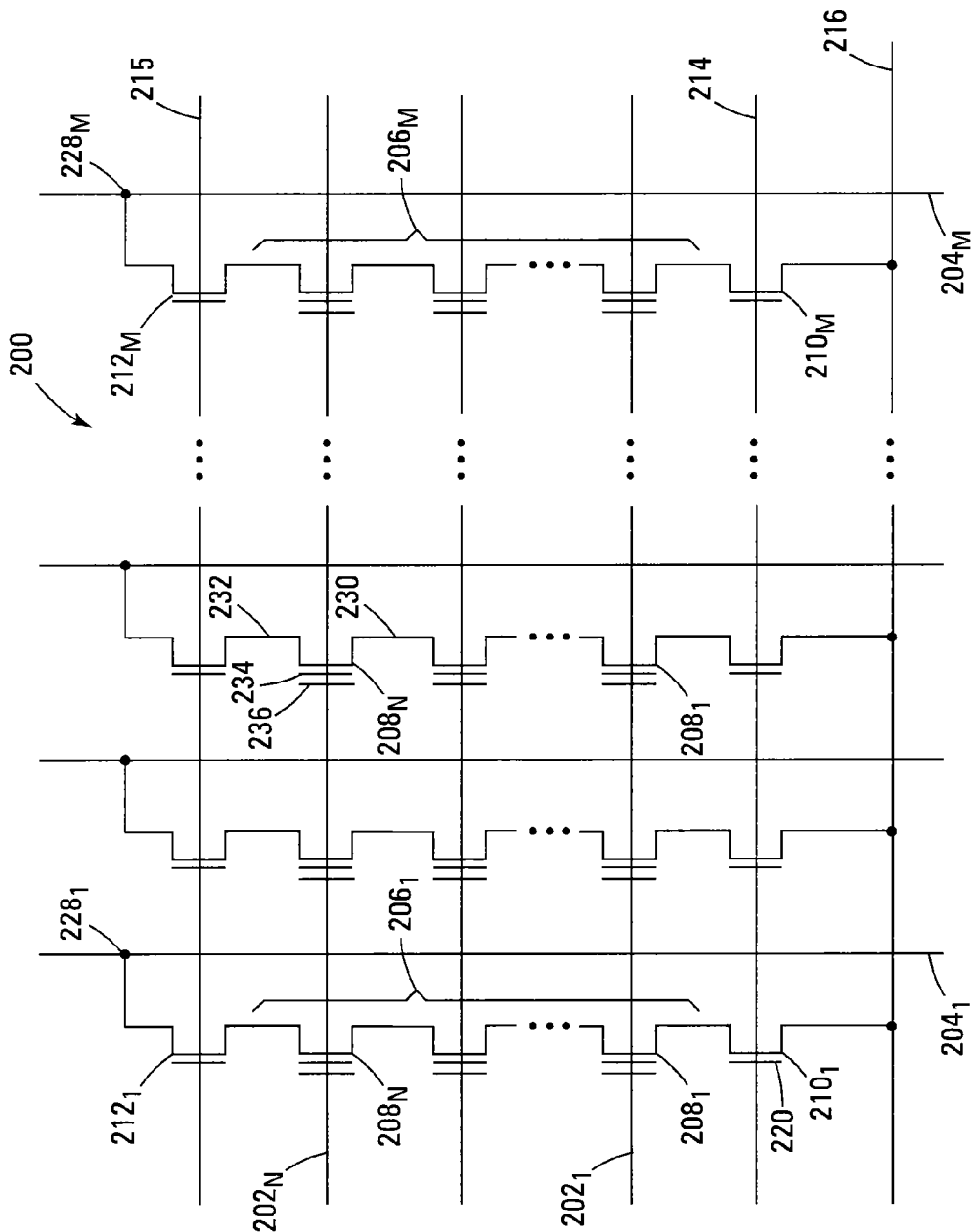
FIG. 2 is a schematic of a NAND memory array in accordance with another embodiment of the invention.

FIG. 2 is a schematic of a NAND memory array 200 as a portion of memory array 104 of FIG. 1 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series, source to drain, between a source select gate 210, e.g., a field-effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Memory array 200 includes isolation regions formed in accordance with embodiments of the invention, e.g., between columns of memory array 200.

Figure 3:
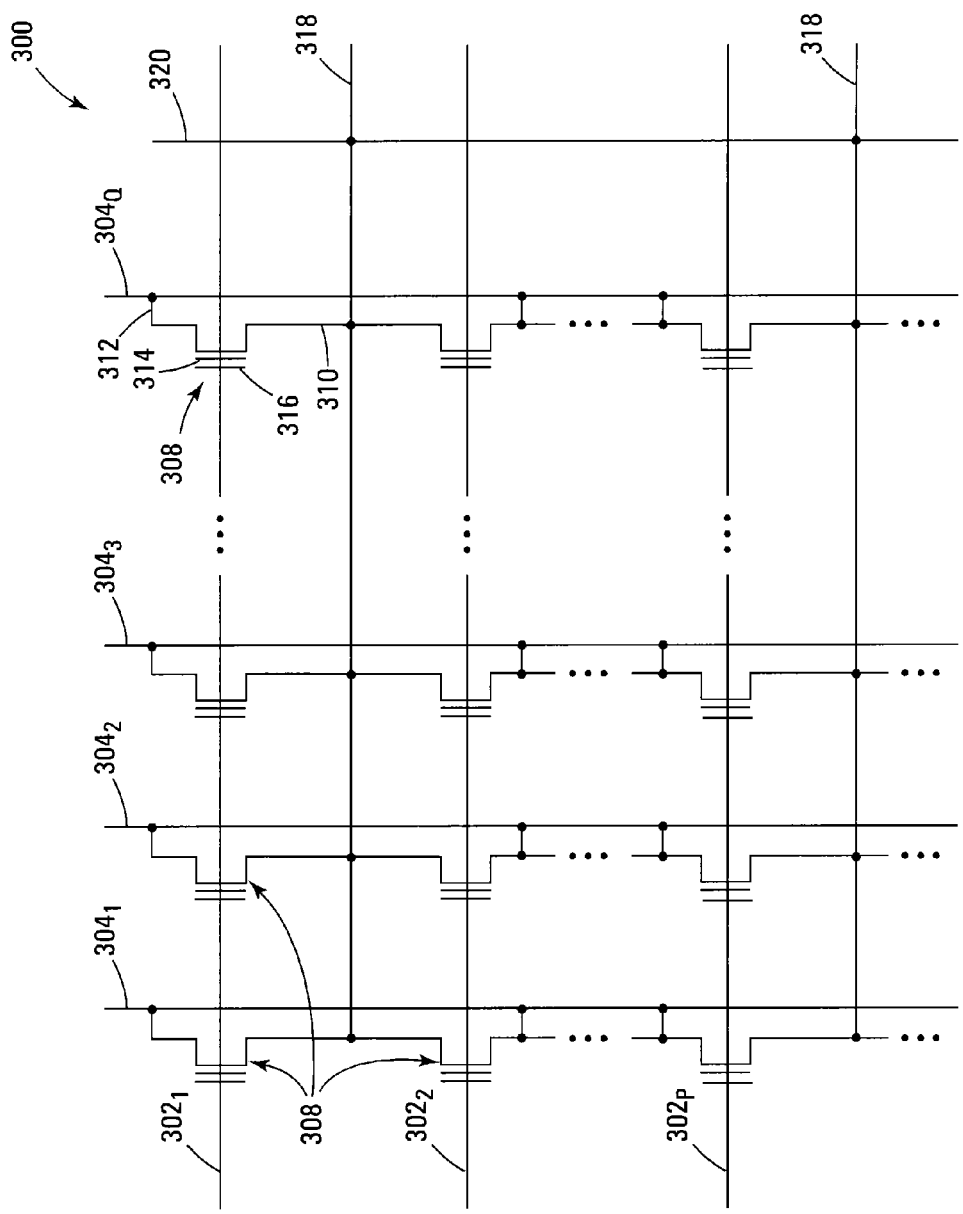
FIG. 3 is a schematic of a NOR memory array in accordance with another embodiment of the invention.

FIG. 3 is a schematic of a NOR memory array 300 as a portion of memory array 104 of FIG. 1 in accordance with another embodiment of the invention. Memory array 300 includes word lines $302_1$ to $302_P$ and intersecting local bit lines $304_1$ to $304_Q$. For ease of addressing in the digital environment, the number of word lines 302 and the number of bit lines 304 are each some power of two, e.g., 256 word lines 302 by 4,096 bit lines 304. The local bit lines 304 are coupled to global bit lines (not shown) in a many-to-one relationship.

Floating-gate transistors 308 are located at each intersection of a word line 302 and a local bit line 304. The floating-gate transistors 308 represent non-volatile memory cells for storage of data. Typical construction of such floating-gate transistors 308 includes a source 310 and a drain 312, a floating gate 314, and a control gate 316.

Floating-gate transistors 308 having their control gates 316 coupled to a word line 302 typically share a common source depicted as array source 318. As shown in FIG. 3, floating-gate transistors 308 coupled to two adjacent word lines 302 may share the same array source 318. Floating-gate transistors 308 have their drains 312 coupled to a local bit line 304. A column of the floating-gate transistors 308 includes those transistors commonly coupled to a given local bit line 304. A row of the floating-gate transistors 308 includes those transistors commonly coupled to a given word line 302. Memory array 300 includes isolation regions formed in accordance with embodiments of the invention, e.g., between columns of memory array 300.

To reduce problems associated with high resistance levels in the array source 318, the array source 318 is regularly coupled to a metal or other highly conductive line to provide a low-resistance path to ground. The array ground 320 serves as this low-resistance path.

Figure 4:
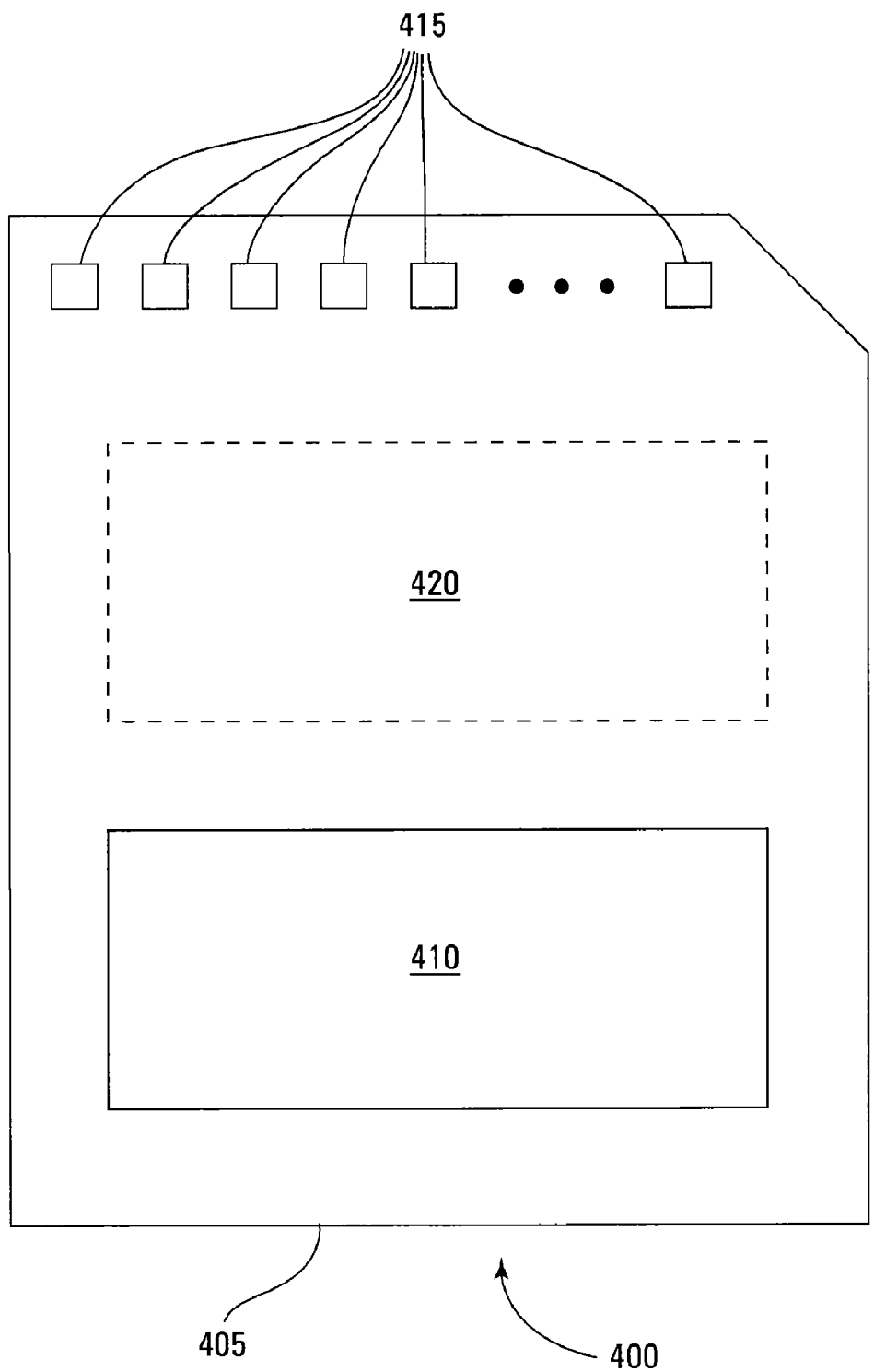
FIG. 4 is an illustration of an exemplary memory module, according to another embodiment of the invention.

FIG. 4 is an illustration of an exemplary memory module 400. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 may be a NAND, NOR, or NROM flash memory device, dynamic random access memory device (DRAM), static random access memory device (SRAM), or the like having a memory array formed in accordance with the methods of the invention. At least one memory device 410 includes isolation regions formed in accordance with the invention. Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. For some embodiments, the contacts 415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 415 provide an interface for passing control, address and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410 such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

Figure 5:
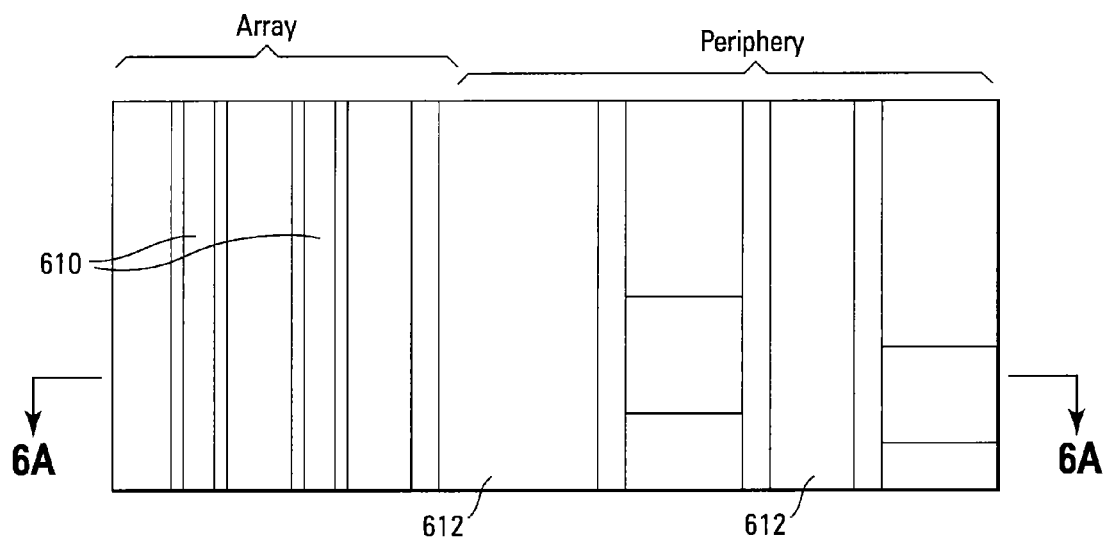
FIG. 5 is a top view of a portion of the memory device after several processing steps have occurred, according to an embodiment of the invention.
Figure 6A:
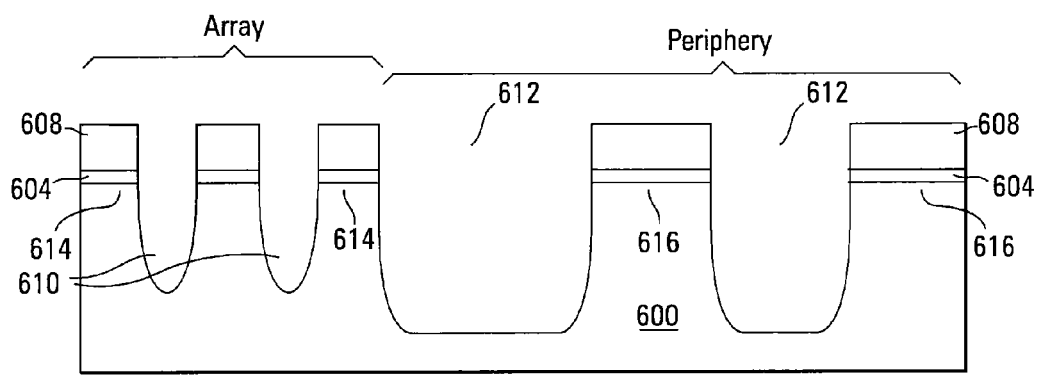
FIGS. 6A-6K are cross-sectional views of a portion of a row of a memory array during various stages of fabrication, according to another embodiment of the invention.

FIG. 5 is a top view of a portion of the memory device after several processing steps have occurred, according to an embodiment of the invention. FIG. 6A is a cross-sectional view of a row of the memory device taken along line 6A-6A of FIG. 5. FIGS. 6A-6K are cross sectional views during various stages of fabrication, according to another embodiment of the invention. For one embodiment, the memory device corresponds to memory device 102 of FIG. 1 or a memory device 410 of FIG. 4. The structure of FIGS. 5 and 6A includes an array portion where an array of memory cells, such as of memory array 104 of memory device 102 of FIG. 1, memory array 200 of FIG. 2, memory array of FIG. 3, or a memory array of a memory device 410 of FIG. 4, will be formed. The structure of FIGS. 5 and 6A further includes a periphery, such as the region 105 of memory device 102, where various integrated circuit elements, including passive elements, such as capacitors, and active elements, such as transistors, e.g., of row access circuitry 108 and column access circuitry 110 of memory 102 of FIG. 1, will be formed. For one embodiment, the active elements include field-effect transistors.

Formation of the type of structure depicted in FIGS. 5 and 6A is well known and will not be detailed herein. In general, however, the array and the periphery are formed concurrently on a semiconductor substrate 600, such as a silicon-containing substrate, e.g., a monocrystalline silicon substrate, a P-type monocrystalline silicon substrate, etc. A sacrificial layer 604, such as a sacrificial dielectric layer, e.g., a sacrificial oxide layer, is formed on substrate 600. For one embodiment, layer 604 is thermally grown on substrate 600. A hard mask (or cap) layer 608, such as a layer of silicon nitride, is formed overlying sacrificial layer 604.

Trenches 610 are formed in the array portion and trenches 612 are formed in the periphery by patterning cap layer 608 and removing portions of layer 604 and of substrate 600 exposed by patterned cap layer 608. Trenches 610 and 612 respectively define active regions 614 in the array portion and active regions 616 in the periphery. Trenches 610 and 612 will be filled with dielectric materials, as described below, to form isolation regions, such as shallow trench isolation (STI) regions. Optionally, for one embodiment, trenches 610 and 612 may be tapered near their bottoms, as shown in FIG. 6A, to improve filling thereof with the dielectric materials.

Figure 6B:
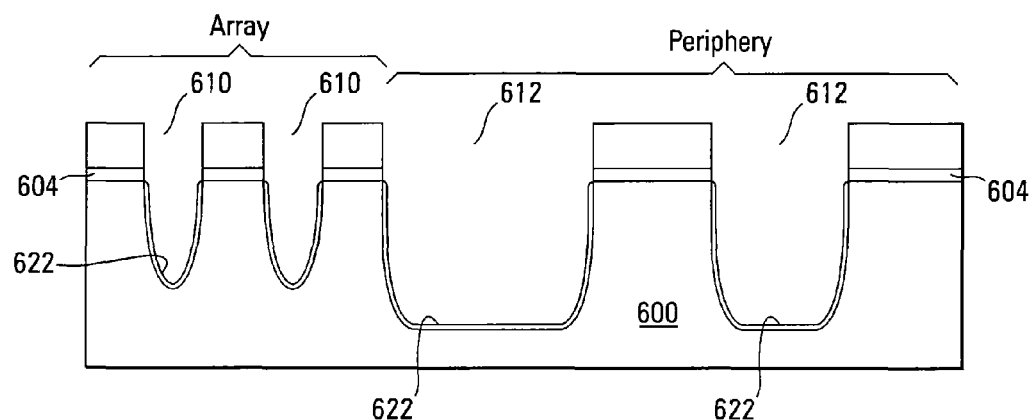
Figure 6C:
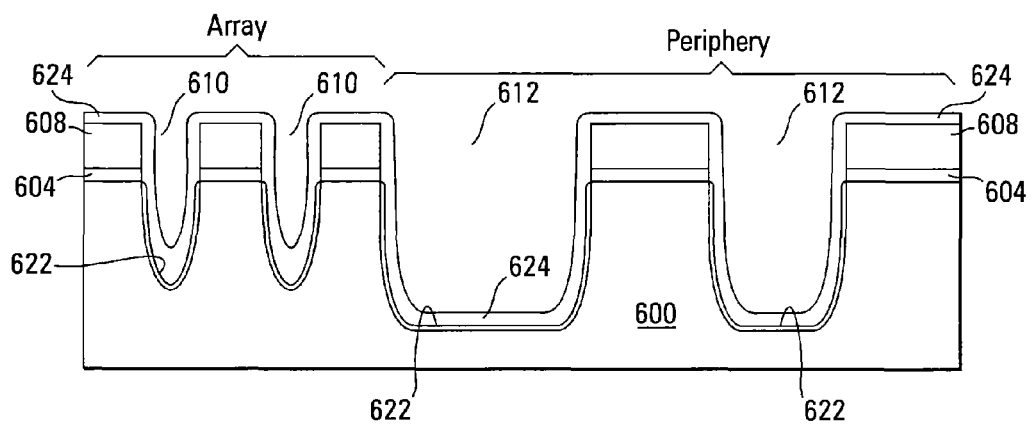

An optional dielectric layer 622 may be formed on portions of the substrate 600 exposed by the trenches 610 and 612 so as to line the portion of trenches 610 and 612 formed in substrate 600, as shown in FIG. 6B. For another embodiment, dielectric layer 622 is an oxide liner layer, such as a thermal oxide, e.g., a deposited high-temperature thermal oxide or a thermally grown oxide. In FIG. 6C, a dielectric layer 624, such as a conformal oxide, e.g., silicon dioxide ($SiO_2$), TEOS (tetraethylorthosilicate), etc., is formed overlying cap layer 608, layer 604, and dielectric layer 622.

Figure 6D:
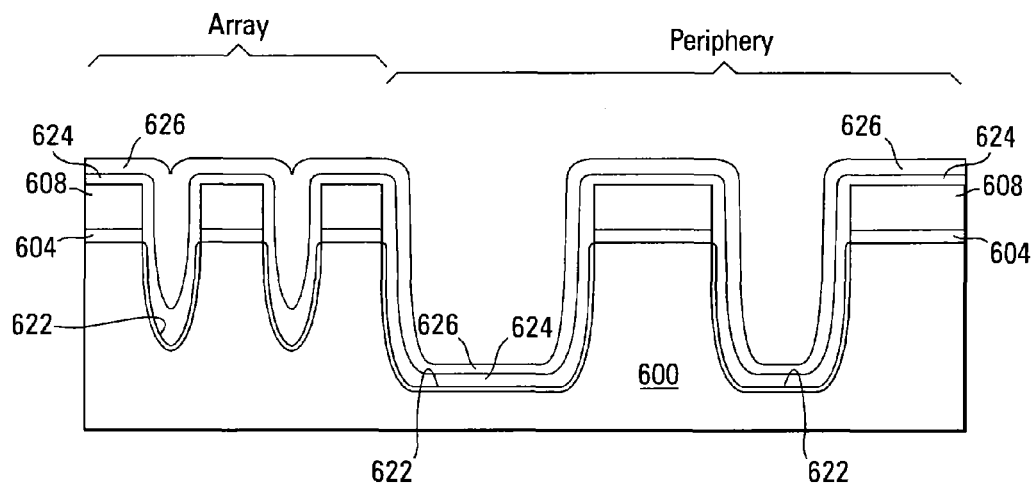

In FIG. 6D, a layer 626 of material that is selectively removable over the material of dielectric layer 624 is formed, e.g., using chemical vapor deposition, etc., overlying dielectric layer 624 so as to substantially fill the trenches in the array region. A material that is selectively removable over the material of dielectric layer 624 may be defined as a material that has a higher removal rate, such as a wet or dry etch rate, over the material of dielectric layer 624. For one embodiment, a ratio of the removal rate of the material of layer 626 to the removal rate of the material of dielectric layer 624 is about 300:1. Suitable materials for layer 626 may include dielectric materials, such as nitrides or oxides, e.g., alumina oxide ($Al_2O_3$), or semiconductor materials, such as amorphous polysilicon. For some embodiments, a portion of dielectric layer 624 may be optionally removed, e.g., using a light etch, as a clean-up step prior to forming layer 626. Note that since the trenches in the periphery have a larger volume than the trenches in the array portion, the material of layer 626 lines the trenches in the periphery, while filling the trenches in the array portion. Also note that layer 626 is formed substantially concurrently in the periphery and array portion. For embodiments where layer 626 is a layer of semiconductor material, the semiconductor may be oxidized so to convert it to dielectric form. For one embodiment, the amorphous polysilicon is deposited at temperature lower than about 520° C.

Figure 6E:
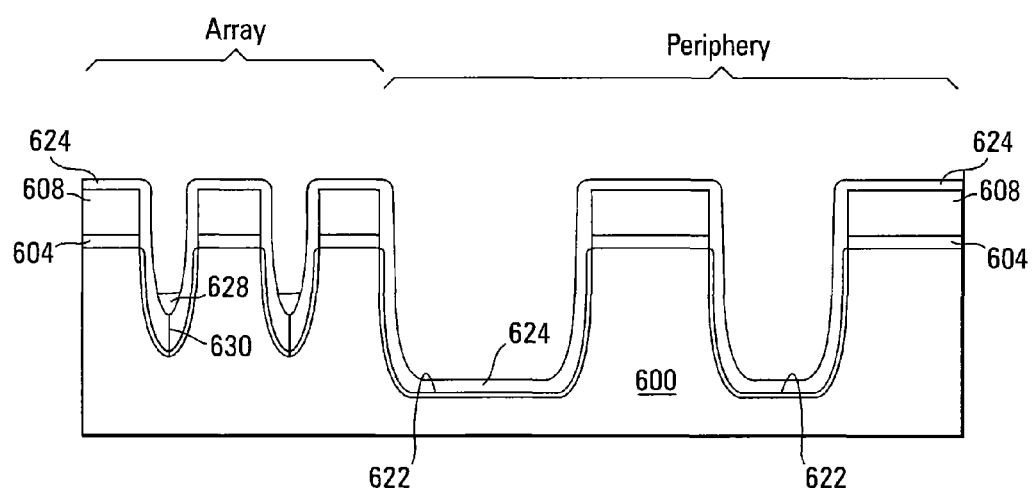

In FIG. 6E, layer 626 is removed from the array portion and the periphery substantially concurrently, e.g., by etching. Since the trenches in the array portion have a higher aspect ratio (depth to width) than the trenches in the periphery, layer 626 is removed at a higher rate from the periphery trenches than from the array trenches by the substantially concurrent removal process. Therefore, when the layer 626 is substantially removed from the periphery trenches, a portion of layer 626 remains in the array trenches, forming a plug 628 of the material of layer 626 at the lower portion of the array trenches.

Plug 628 may act to plug a seam 630 that may form in dielectric layers 622 and 624 during their formation in the array trenches because of their rather large aspect ratio. Note that seam 630 may typically form at or near the lowermost portion of dielectric layers 622 and 624 and extend to substrate 600. Plug 628 acts to prevent seam 630 from being opened up by subsequent processing steps, such as subsequent etching. Opening up of seams 630 can lead to the formation of voids in dielectric layers 622 and 624, and thus subsequently formed isolation regions. Therefore, plugs 628 act to prevent the formation of these voids.

Figure 6F:
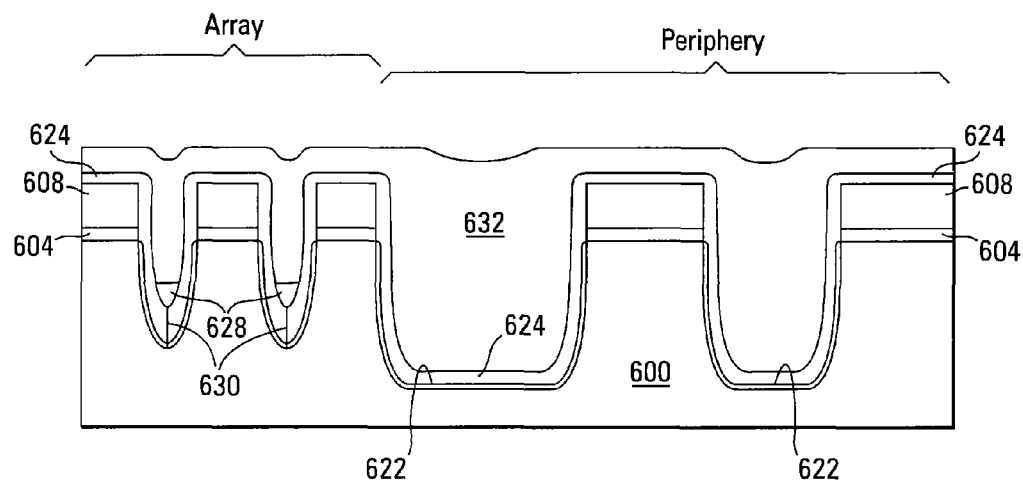

In FIG. 6F, a dielectric layer 632 is formed overlying the structure of FIG. 6E. For one embodiment, dielectric layer 632 is a high-density plasma dielectric, such as a high-density plasma oxide, e.g., silicon dioxide, deposited using a high-density plasma (HDP) process. For one embodiment, an optional layer of dielectric material, such as an oxide, may be formed on dielectric layer 624 and plug 628 prior to forming dielectric layer 632. For another embodiment, dielectric layer 624 is partially or completely removed, e.g., using a wet etch, such as a wet oxide etch, before forming dielectric layer 632. This acts to decrease the aspect (or trench-depth-to-trench-width) ratios of the trenches, thereby assisting the formation of dielectric layer 632 within in the trenches, e.g., by reducing the likelihood of void formation.

Figure 6G:
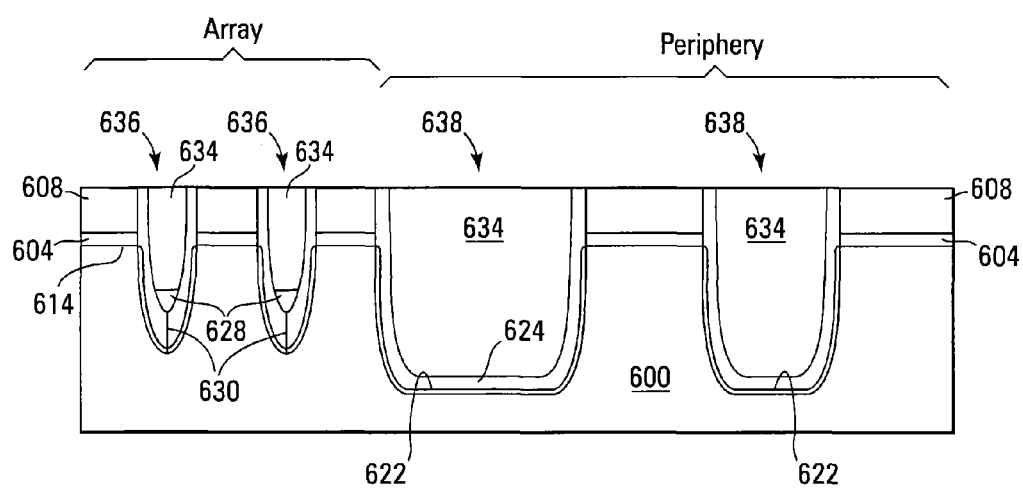

In FIG. 6G, a portion of dielectric layer 632 is removed, e.g., by chemical mechanical planerization (CMP), stopping on dielectric layer 608 so that the remaining portion of dielectric layer 632 forms a dielectric plug 634 having an upper surface substantially flush with dielectric layer 608. Note that dielectric plugs 634 overlie plug 628 and dielectric layers 624 and 622 in the array portion to form isolation regions 636 in the array portion. Moreover, dielectric plugs 634 overlie dielectric layers 624 and 622 in the periphery to form isolation regions 638 in the periphery.

Note that for embodiments where plugs 628 of isolation regions 636 are of an untreated semiconductor material, such as amorpous polysilicon, the plugs 628 have little or no impact the electrical isolation properties of isolation regions 636. This is because plugs 628 are at a relatively large distance from the active regions 614.

Figure 6H:
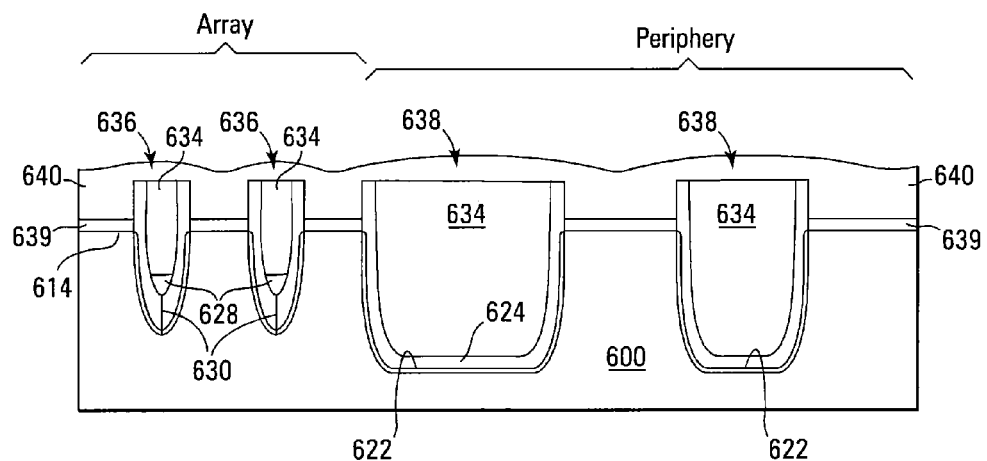
Figure 6I:
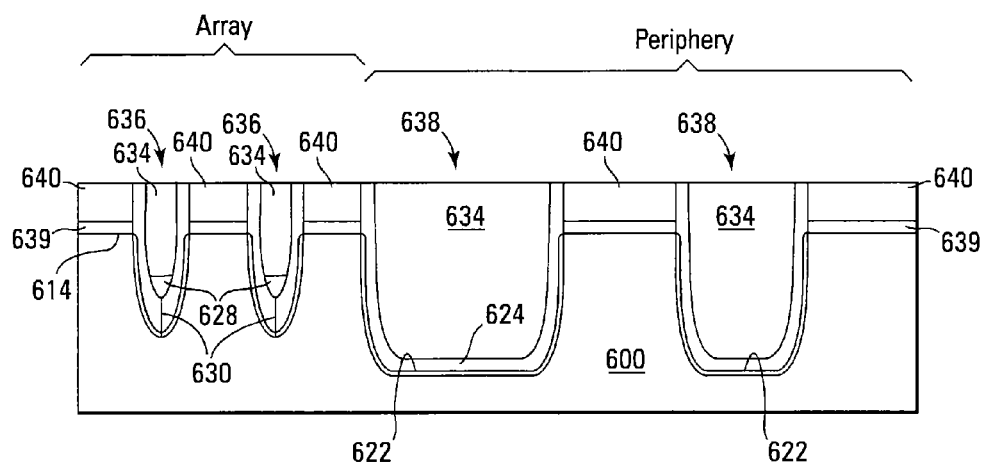

In FIG. 6H, cap layer 608 and layer 604 are removed, such as by etching, e.g., using a wet or dry etch, to expose portion of substrate 600. A dielectric layer 639 e.g., an oxide layer, such as a thermally grown oxide layer, is formed overlying the exposed portions of substrate 600 in the array portion and in the periphery. A conductive layer 640, e.g., a layer of doped polysilicon, is formed overlying dielectric layer 639 in the array portion and in the periphery and overlying isolation regions 636 in the array portion and isolation regions 638 in the periphery. In FIG. 6I, a portion of conductive layer 640 is removed, e.g., by CMP, stopping on plugs 634 so that an upper surface of remaining portions of conductive layer 640 are substantially flush with upper surfaces of isolation regions 636 and 638.

Figure 6J:
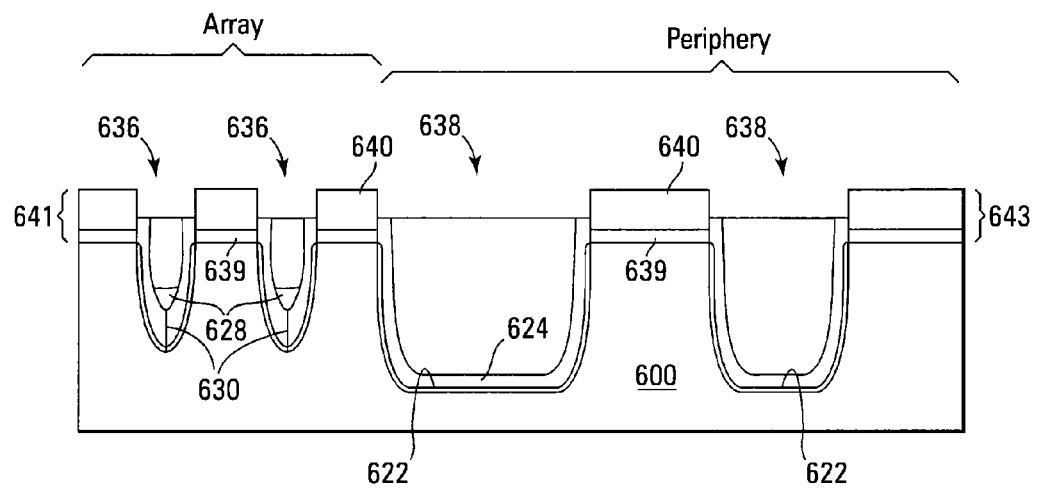

In FIG. 6J, a portion of isolation regions 636 and 638 is removed, such as by etching in an etch-back process, so that upper surfaces of isolation regions 636 and 638 are recessed below an upper surface of conductive layer 640. Note that dielectric layer 639 forms a tunnel dielectric layer and conductive layer 640 forms a floating gate layer of gate stacks 641 of future memory devices in the array portion. Dielectric layer 639 forms a gate dielectric layer and conductive layer 640 forms at least a portion of a control gate layer, for one embodiment, of gate stacks 643 of future active devices, such as field-effect transistors, in the periphery.

Figure 6K:
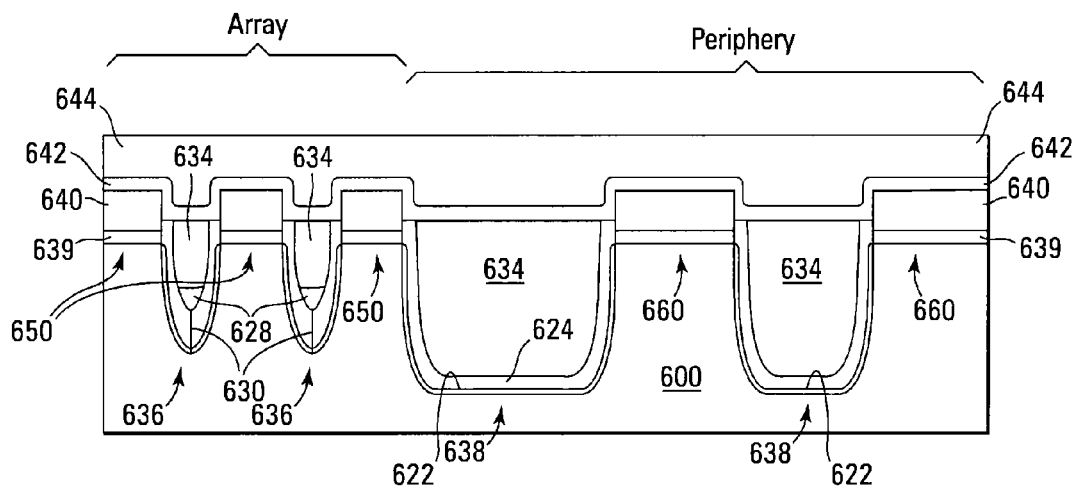

In FIG. 6K, a dielectric layer 642 is formed on conductive layer 640 of gate stacks 641 and 643 and the exposed upper surfaces of isolation regions 636 and 638, and a conductive layer 644 is formed overlying dielectric layer 642. For one embodiment, dielectric layer 642 forms an interlayer dielectric layer of the future memory cells. For another embodiment, dielectric layer 642 may be one or more layers of dielectric material. For example, dielectric layer 642 could be of a multi-layer dielectric material commonly referred to as ONO (oxide-nitride-oxide). Other dielectric materials may be substituted for the ONO, such as tantalum oxide, barium strontium titanate, silicon nitride, and other materials providing dielectric properties.

For one embodiment, conductive layer 644 forms a control gate layer (or word line) of memory cells 650, e.g., floating-gate memory cells (or floating-gate transistors), in the array portion and may form a portion of a control gate layer of field-effect transistors 660 in the periphery. Conductive layer 644 is generally one or more layers of conductive material. For one embodiment, conductive layer 644 contains a conductively-doped polysilicon. For a further embodiment, conductive layer 644 includes a metal-containing layer overlying a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, conductive layer 644 contains multiple metal-containing layers, e.g., a titanium nitride (TiN) barrier layer on dielectric layer 642, a titanium (Ti) adhesion layer on the barrier layer, and a tungsten (W) layer on the adhesion layer. An insulative cap layer (not shown) is often formed overlying conductive layer 644 to protect and isolate conductive layer 644 from further processing.

For some embodiments, the conductive layer 644 and the conductive layer 640 of field-effect transistors 660 may be strapped (or shorted) together so that the shorted together conductive layers 644 and 640 form control gates of the field-effect transistors 660. For another embodiment, the conductive layers 644 and 640 are not shorted together, and conductive layer 640 forms the control gate of the field-effect transistors 660. Note that field-effect transistors 660, for one embodiment, form a portion of the logic of row access circuitry 108 and/or column access circuitry 110 of the memory device 102 of FIG. 1 for accessing rows and columns of the memory array 104.

It is noted that FIGS. 6A-6K depict a portion of a row of memory cells, such as a row 202 of FIG. 2 or a row 302 of FIG. 3, running parallel to a face plane of the drawings. Columns of memory cells, separated by the isolation regions 636, run perpendicular to the drawings, with source and drain regions formed at opposing ends, one above the face plane of the figures and one below the face plane of the figures. Isolation regions 636 act to electrically isolate memory cells of adjacent columns from each other. An isolation region 638 adjacent the array portion acts to electrically isolate the periphery devices, e.g., field-effect transistors 660, from the memory array. Another isolation region 638 disposed between adjacent periphery devices, e.g., field-effect transistors 660, acts to electrically isolate these devices from each other. It is noted that FIGS. 6A-6K can depict either a NOR-type memory device or a NAND-type memory device, with the differences occurring in the column direction in manners that are well understood in the art of memory fabrication.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An integrated circuit device, comprising:
a trench that extends into a substrate;
a first dielectric layer lining the trench and having a portion extending above an upper surface of the substrate;
a plug formed on the first dielectric layer in a lower portion of the trench, an upper surface of the plug located below the upper surface of the substrate; and
a second dielectric layer formed on the upper surface of the plug and the first dielectric layer in an upper portion of the trench, an upper surface of the second dielectric layer substantially flush with an upper surface of the portion of the first dielectric layer that extends above the upper surface of the substrate.

2. The integrated circuit device of claim 1, wherein portions of the first and second dielectric layers pass through a third dielectric layer formed on the upper surface of the substrate and a portion of a conductive layer disposed on the third dielectric layer.

3. The integrated circuit device of claim 1, wherein the plug acts to plug a seam in the first dielectric layer.

4. The integrated circuit device of claim 1 further comprises a third dielectric layer overlying the upper surface of the second dielectric layer and the upper surface of the portion of the first dielectric layer that extends above the upper surface of the substrate.

5. The integrated circuit device of claim 1, wherein the first dielectric layer comprises third and fourth layers of dielectric material.

6. The integrated circuit device of claim 1, wherein the first dielectric layer is selected from the group consisting of an oxide, silicon dioxide, and TEOS.

7. The integrated circuit device of claim 1, wherein the second dielectric layer is selected from the group consisting of a high-density plasma dielectric and a high-density plasma oxide.

8. The integrated circuit device of claim 1, wherein the plug is of a material selected from the group consisting of a dielectric, a semiconductor material, nitride, oxide, polysilicon, and oxidized polysilicon.

9. The integrated circuit device of claim 4 further comprises a conductive layer overlying the third dielectric layer.

10. The integrated circuit device of claim 5, wherein the third layer of dielectric material adjoins the substrate and is selected from the group consisting of an oxide, a thermally grown oxide, and a deposited high-temperature thermal oxide.

11. The integrated circuit device of claim 10, wherein the fourth layer of dielectric material overlies the third layer of dielectric material and is selected from the group consisting of an oxide, silicon dioxide, and TEOS.

12. An integrated circuit device, comprising:
one or more first trenches that extend into a first portion of a substrate;
one or more second trenches that extend into a second portion of the substrate, and having a larger volume than the one or more first trenches;
a first dielectric layer lining the one or more first trenches and the one or more second trenches, the first dielectric layer having a portion extending above an upper surface of the substrate;
a plug formed on the first dielectric layer in a lower portion of the one or more first trenches, an upper surface of the plug located below the upper surface of the substrate; and
a second dielectric layer formed on the upper surface of the plug and the first dielectric layer in an upper portion of the one or more first trenches and on the first dielectric layer in the one or more second trenches, an upper surface of the second dielectric layer in the one or more first trenches and the one or more second trenches substantially flush with an upper surface of the portion of the first dielectric layer that extends above the upper surface of the substrate.

13. The integrated circuit device of claim 12, wherein portions of the first and second dielectric layers pass through a third dielectric layer formed on the upper surface of the substrate and a portion of a conductive layer formed on the third dielectric layer.

14. A memory device, comprising:
a memory array having a plurality of intersecting rows and columns formed on a substrate, each intersection of a row and column defining a memory cell; and
an isolation region disposed between adjacent columns of memory cells, wherein the isolation region comprises:
a first dielectric layer lining a trench that extends into the substrate, the first dielectric layer having a portion extending above an upper surface of the substrate;
a plug formed on the first dielectric layer in a lower portion of the trench, an upper surface of the plug located below the upper surface of the substrate; and
a second dielectric layer formed on the upper surface of the plug and the first dielectric layer in an upper portion of the trench, an upper surface of the second dielectric layer substantially flush with an upper surface of the portion of the first dielectric layer that extends above the upper surface of the substrate.

15. A floating-gate memory device comprising:
an array of floating-gate memory cells having a plurality of intersecting rows and columns formed on a substrate, each intersection of a row and column defining a floating-gate memory cell, each floating-gate memory cell comprising:
a tunnel dielectric layer formed on an upper surface of the substrate of the memory device;
a floating gate layer formed on the tunnel dielectric layer;
an intergate dielectric layer formed on the floating gate layer; and
a control gate layer formed on the intergate dielectric layer; and
an isolation region disposed between adjacent columns of the floating-gate memory cells,
wherein the isolation region comprises:
a third dielectric layer lining a trench that extends into the substrate, the third dielectric layer having a portion extending above an upper surface of the substrate;
a plug formed on the third dielectric layer in a lower portion of the trench, an upper surface of the plug located below the upper surface of the substrate; and
a fourth dielectric layer formed on the upper surface of the plug and the third dielectric layer in an upper portion of the trench, an upper surface of the fourth dielectric layer substantially flush with an upper surface of the portion of the third dielectric layer that extends above the upper surface of the substrate.

16. A memory device, comprising:
a memory array having a plurality of intersecting rows and columns formed on a substrate, each intersection of a row and column defining a memory cell;
a periphery having at least one active device; and a first isolation region disposed between adjacent columns of the memory cells of the memory array and a second isolation region disposed in the periphery;

wherein the first and second isolation regions respectively comprise a first dielectric layer lining a first trench that extends into the substrate and a second trench that extends into the substrate, the first dielectric layer having a portion extending above an upper surface of the substrate;

wherein the first isolation region further comprises a plug formed on the first dielectric layer in a lower portion of the first trench, an upper surface of the plug located below the upper surface of the substrate; and wherein the first isolation region and the second isolation region respectively further comprise a second dielectric layer formed on the upper surface of the plug and the first dielectric layer in an upper portion of the first trench and on the first dielectric layer in the second trench, an upper surface of the second dielectric layer substantially flush with an upper surface of the portion of the first dielectric layer that extends above the upper surface of the substrate.

17. The memory device of claim 16, wherein the second isolation region is formed between a column of memory cells and the at least one active device.

18. The memory device of claim 16, wherein the at least one active device is a first active device and wherein the second isolation region is formed between the first active device and a second active device disposed on the periphery.

19. A memory device, comprising:
a first dielectric layer formed on first and second portions of a substrate;
a first conductive layer formed on the first dielectric layer;
a first trench passing through the first dielectric layer and a portion of the first conductive layer and extending into the first portion of the substrate;
a second trench passing through the first dielectric layer and a portion of the first conductive layer and extending into the second portion of the substrate;
a second dielectric layer lining the first and second trenches, the second dielectric layer having a portion extending above an upper surface of the first and second portions of the substrate;
a plug formed on the second dielectric layer in a lower portion of the first trench, an upper surface of the plug located below the upper surface of the first portion of the substrate;
a third dielectric layer formed on the upper surface of the plug and the second dielectric layer in an upper portion of the first trench and on the second dielectric layer in the second trench, an upper surface of the third dielectric layer in the first trench and the second trench substantially flush with an upper surface of the portion of the second dielectric layer that extends above the upper surface of the first and second portions of the substrate;
a fourth dielectric layer formed on the first conductive layer, on the third dielectric layer, and on the upper surface of the portion of the second dielectric layer that extends above the upper surface of the first and second portions of the substrate and overlying the first and second portions of the substrate; and
a second conductive layer overlying the fourth dielectric layer.

* * * * *